(12) United States Patent
Lyden et al.

(10) Patent No.: US 9,231,539 B2
(45) Date of Patent: Jan. 5, 2016

(54) AMPLIFIER, A RESIDUE AMPLIFIER, AND AN ADC INCLUDING A RESIDUE AMPLIFIER

(71) Applicants: Colin G. Lyden, Baltimore (IE); Christopher Peter Hurrell, Cookham (GB); Derek Hummerston, Hungerford (GB)

(72) Inventors: Colin G. Lyden, Baltimore (IE); Christopher Peter Hurrell, Cookham (GB); Derek Hummerston, Hungerford (GB)

(73) Assignee: ANALOG DEVICES GLOBAL, Hamilton (BM)

( * ) Notice: Subject to any disclaimer, the term of this patent is extended or adjusted under 35 U.S.C. 154(b) by 82 days.

(21) Appl. No.: 13/787,065

(22) Filed: Mar. 6, 2013

(65) Prior Publication Data

US 2014/0253237 A1 Sep. 11, 2014

(51) Int. Cl.
*H03F 3/45* (2006.01)
*H03M 1/16* (2006.01)

(52) U.S. Cl.
CPC ........ *H03F 3/45076* (2013.01); *H03F 3/45183* (2013.01); *H03M 1/164* (2013.01)

(58) Field of Classification Search
CPC .......................................................... H03F 1/02
USPC ..................................... 330/9, 86; 327/91, 94
See application file for complete search history.

(56) References Cited

U.S. PATENT DOCUMENTS

| | | | | |
|---|---|---|---|---|
| 4,894,620 | A | * | 1/1990 | Nagaraj .......................... 327/91 |
| 6,384,641 | B1 | * | 5/2002 | Kase ............................... 327/91 |
| 2014/0125407 | A1 | * | 5/2014 | Kapusta et al. ............... 330/110 |

* cited by examiner

*Primary Examiner* — Steven J Mottola
(74) *Attorney, Agent, or Firm* — Kenyon & Kenyon, LLP (57) ABSTRACT

An amplifier, comprising: an input node; an output node; a gain stage having a gain stage inverting input, a gain stage non-inverting input and a gain stage output; a feedback capacitor connected in a signal path between the gain stage output and the gain stage inverting input; a sampling capacitor connected between the input node and the gain stage inverting input, and a controllable impedance in parallel with the feedback capacitor, wherein the controllable impedance is operable to switch between a first impedance state in which it does not affect current flow through the feedback capacitor, and a second impedance state in which it cooperates with the feedback capacitor form a bandwidth limiting circuit.

20 Claims, 5 Drawing Sheets

AMPLIFIER, A RESIDUE AMPLIFIER, AND AN ADC INCLUDING A RESIDUE AMPLIFIER

FIELD OF THE INVENTION

The present invention relates to an amplifier, a residue amplifier and an ADC including a residue amplifier.

BACKGROUND

It is known that amplifier circuits can be used in conjunction with sampling circuits to acquire and hold a signal, and to apply gain to it. Such circuits are subject to noise, and it is desirable to reduce the noise power that is sampled. Such amplifier and sampling circuit combinations may also be used to form a difference between two signals. Such amplifiers may be provided in analog to digital converters (ADC) to amplify a residue that is passed from one stage of a pipelined ADC to a subsequent stage.

SUMMARY OF THE INVENTION

According to a first aspect of the present invention there is provided an amplifier, comprising:
  an input node;
  an output node;
  a gain stage having a gain stage inverting input, a gain stage non-inverting input and a gain stage output;
  a feedback capacitor connected in a signal path between the gain stage output and the gain stage inverting input;
  a sampling capacitor connected between the input node and the gain stage inverting input; and
  a controllable impedance in parallel with the feedback capacitor,
wherein the controllable impedance is operable to switch between a first impedance state in which it does not affect current flow through the feedback capacitor, and a second impedance state in which it cooperates with the feedback capacitor to form a bandwidth limiting circuit.

It is thus possible, by a suitable selection of component values, to reduce the noise power within the amplifier and its associated sampling circuits, which may be used in a residue amplifier to form a difference between two input signals.

According to a second aspect of the invention there is provided a method of reducing noise sampled into a sampling circuit, the sampling circuit comprising a sampling capacitor in association with a sampling switch, wherein an amplifier in association with a bandwidth limiting circuit is connected to a plate of the capacitor and is operable during a first phase to limit the noise sampled into the sampling circuit, and during a second phase of operation the amplifier acts as a charge transfer amplifier.

BRIEF DESCRIPTION OF THE DRAWINGS

Embodiments of the invention will now be described, by way of non limiting example only, with reference to the accompanying drawings, in which.

DESCRIPTION OF SOME EMBODIMENTS OF THE INVENTION

Figure 1:
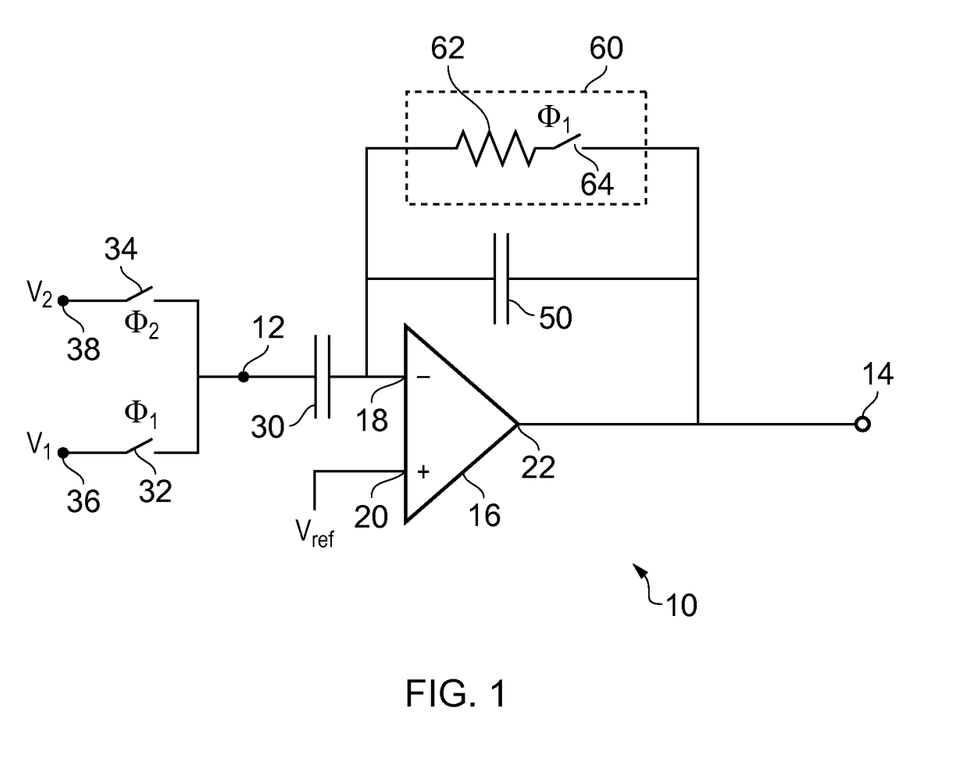
FIG. 1 is a circuit diagram of an amplifier according to an embodiment of the invention.

FIG. 1 is a circuit diagram of an amplifier constituting an embodiment of the present invention. The amplifier, generally designated 10, may, for example, be used as a residue amplifier between stages of a pipelined analog to digital converter. However it might also be used in other circuits where a signal needs to be acquired onto a sampling capacitor, and a gained up version of that signal is output.

In general terms, the amplifier 10 comprises an input node 12 and an output node 14. The amplifier also comprise a gain block 16 having a gain block inverting input 18, a gain block non-inverting input 20 and a gain block output 22. The gain block output 22 may be directly connected to the output node 14, as shown, or may be selectively connectable to the output node via further circuitry, such as a switch, where it is desirable to ensure that the output node 14 can present a high impedance.

The gain block inverting input 18 is connected to the input node 12 by a sampling capacitor 30. One or more signals to be sampled onto the sampling capacitor 30 can be provided to the input node 12 by way of switches, of which a first switch 32 and a second switch 34 which receive signals V1 and V2 at signal nodes 36 and 38 respectively, are examples.

The amplifier also comprises a feedback capacitor 50 connected between the gain block inverting input 18 and the gain block output 22. A controllable impedance 60 is also connected between the gain block inverting input 18 and the gain block output 22.

The controllable impedance 60 comprises a resistor 62 in series with a switch 64. The switch 64, which may be formed by a field effect transistor, is switchable between a first state in which it presents a high impedance, and a second state in which it presents a low impedance. When the switch 64 is in a high impedance state substantially no current flows through the controllable impedance 60, and hence the gain block 16 only sees the feedback capacitor 50 in its feedback loop. When the switch 64 is in its low impedance state, then the controllable impedance 60 behaves substantially like a resistor in parallel with the feedback capacitor 50.

Prior art residue amplifiers are known which are similar, but where the controllable impedance is omitted, and a simple shorting switch is provided in parallel with the feedback capacitor 50.

Figure 2:
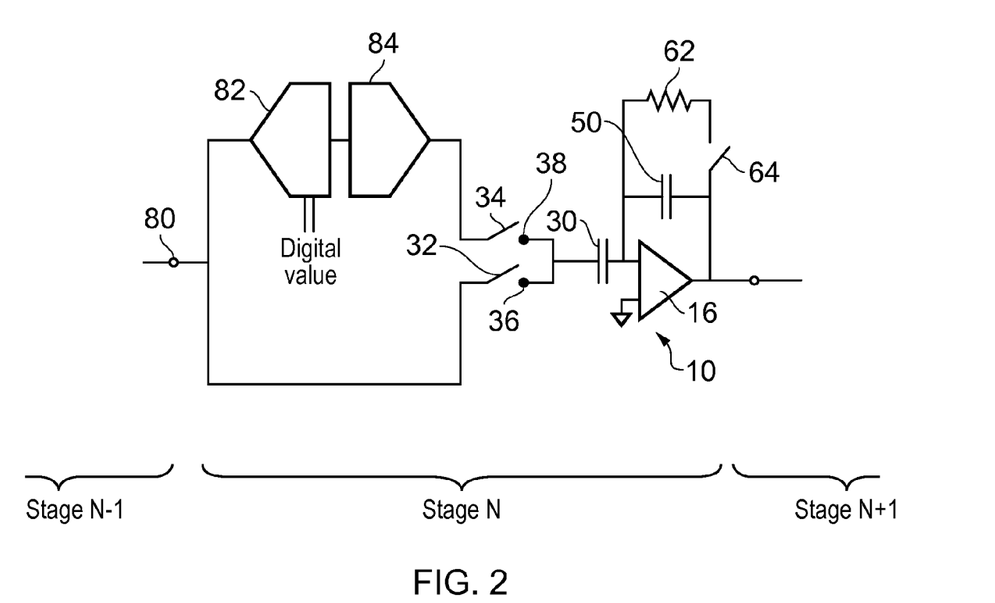
FIG. 2 is a schematic diagram of a stage of a pipelined analog to digital converter including a residue amplifier according to an embodiment of the invention.

As noted before, the amplifier 10 may be used as a residue amplifier within a pipelined ADC. For completeness FIG. 2 schematically represents an Nth stage of a pipeline converter. The Nth stage is shown as being preceded by an N−1th stage and followed by an N+1th stage. It will be evident to the person skilled in the art that one of the N−1th and the N+1th stages may be omitted.

The signal at an input node 80 of the Nth stage is split into two signal paths. One path may be provided directly as a signal V1 to signal node 36. The other signal path goes to an ADC 82 which forms a digital approximation of the input signal. The approximation may result in an analog equivalent of the digital word being directly derivable from the ADC 82. However, if the ADC 82 does not output an analog value equivalent to its digital word, then the digital output of the ADC 82 is provided as an input to a digital to analog converter 84 which provides an analog output $V_{DAC}$ as the signal V2 to signal node 38.

Thus, it can be seen that the signals V1 and V2 should be very similar, and the difference V1−V2 is the "residue" between the analog input to the Nth stage, and the digital approximation thereof.

For completeness it should be noted that the Nth stage of the pipelined ADC may convert one or several bits of the output word of the pipelined converter, and the residue is generally subject to gain when it is passed from one stage to the next as this improves linearity and noise performance of the pipelined converter.

The residue amplifier 10 is a source of offset. The structure provided herein enables an offset cancellation to occur. The amplifier, and the sampling circuit around it, are also sources of noise. The present invention enables the noise performance of the residue amplifier to be improved compared to prior art circuits.

To start with, the operation of the circuit will be explained in respect of its offset reduction (auto-zero) capability.

The switches 32 and 34 are driven from clocks φ1 and φ2 and are never simultaneously "on" (for example high or "1") or in transition at the same time, but can both be in an off (for example low or 0) state simultaneously.

During a first half of an operating cycle φ1 is asserted so switch 32 is closed (low impedance) and φ2 is unasserted so switch 34 is open (high impedance).

The switch 64 in the controllable impedance may also be driven from φ1, and hence is closed. The amplifying action of the gain block 16 is to hold the voltage at its inverting input 18 to be the same as the voltage at its non-inverting input 20. The non-inverting input 20 may be connected to reference voltage $V_{ref}$ such as a mid-point between the supply rails $V_{dd}$ and $V_{ss}$ (not shown) to the gain block, to a reference voltage or to a small signal ground.

Thus in the first phase, the sampling capacitor is charged to a voltage $$V_{sample1} = V1 - V_{ref} \quad \text{equation 1}$$

However, in practice the gain block has an input offset voltage due to imperfections in the input stage, which can be regarded as a voltage $V_{in\_off}$ that is added to the signal at the non-inverting input.

Closing switch 64 places this input referred offset voltage in the gain end feedback path of the amplifier, such that if the gain block has a gain of A (when the feedback loop is broken) then the input referred offset $V_{in\_off}$ is reduced by a factor of A.

Closing switch 64 also allows the capacitor 50 to discharge such that there is no voltage difference across it.

In a second phase of operation, and once the ADC 82 and the DAC 84 have had time to operate, φ2 is asserted and φ1 is de-asserted.

This action causes the sampling capacitor to charge to a value $$V_{sample2} = V2 - V_{ref} \quad \text{equation 2}$$

The difference $$V_{sample2} - V_{sample1} = V2 - V1 \quad \text{equation 3}$$

Any difference in voltage results in a charge flow to or from the sampling capacitor 30, and the same charge flow also occurs in the feedback capacitor 50.

Thus, the action of the circuit is to
1) Autozero the amplifier during the first phase; and
2) Form $$V2 - V1 \times \frac{C_{sample}}{C_{feedback}}$$

during phase 2.

where $C_{sample}$ is the capacitance of the sampling capacitor 30, and $C_{feedback}$ is the capacitance of the feedback capacitor 50.

Thus if the sampling capacitor has a capacitance of 1 pF and the feedback capacitor 50 had a capacitance of 0.1 pF the residue V2−V1 would be subjected to a gain of 10.

Now, if we consider the noise performance of the circuit, the noise in the system, or total noise power $N_{pr}$, is the product of the noise spectral density and the bandwidth.

For an RC filter, the noise power spectral density is $$V^2 n = 4 k_B T r \quad \text{equation 4}$$

where $k_B$ is Boltzmann's constant

T is temperature in Kelvin

R is resistance in ohms

The bandwidth of an RC circuit is $$BW = \frac{1}{RC} \cdot \frac{\pi}{2} \cdot \frac{1}{2\pi} \quad \text{equation 5}$$

so the noise power simplifies to $$\frac{4 k_B \cdot T \cdot R}{4 R \cdot C} = \frac{k_B T}{C} \quad \text{equation 6}$$

The resistance can be any resistance in combination with the capacitor, such as the resistance of the input switches. The fact that the resistance both gives rise to the thermal noise, and bandwidth limits the RC filter gives rise to the supposedly inevitable result that the sampled noise power will be $$\frac{k_B T}{C}$$

However this is not always the case and the noise power can be reduced below this value with suitable selection of components.

In the present invention the bandwidth varies depending on which of φ1 and φ2 and are being asserted. This is used to vary the noise performance.

Initially, consider the prior art case where the variable impedance 60 is not provided, and instead a simple switch is provided.

The gain stage inverting input acts as a virtual earth. Noise from the impedance of the sample switches and from the amplifier front end can be sampled onto the sampling capacitor 30. The noise bandwidth is constrained by a filter formed by the sampling capacitor and the series resistance of the sampling switches and the shorting switch. In general these are small.

Thus, if the switches had an on resistance of 10106 and the sampling capacitor was $1_pF$ then the noise bandwidth would be $$\frac{1}{4 \times 10 \times 1 \times 10^{-12}} = 25 \text{ GHz} \qquad \text{equation 7}$$

This is reduced, where current has to flow through the gain block 16.

Figure 3:
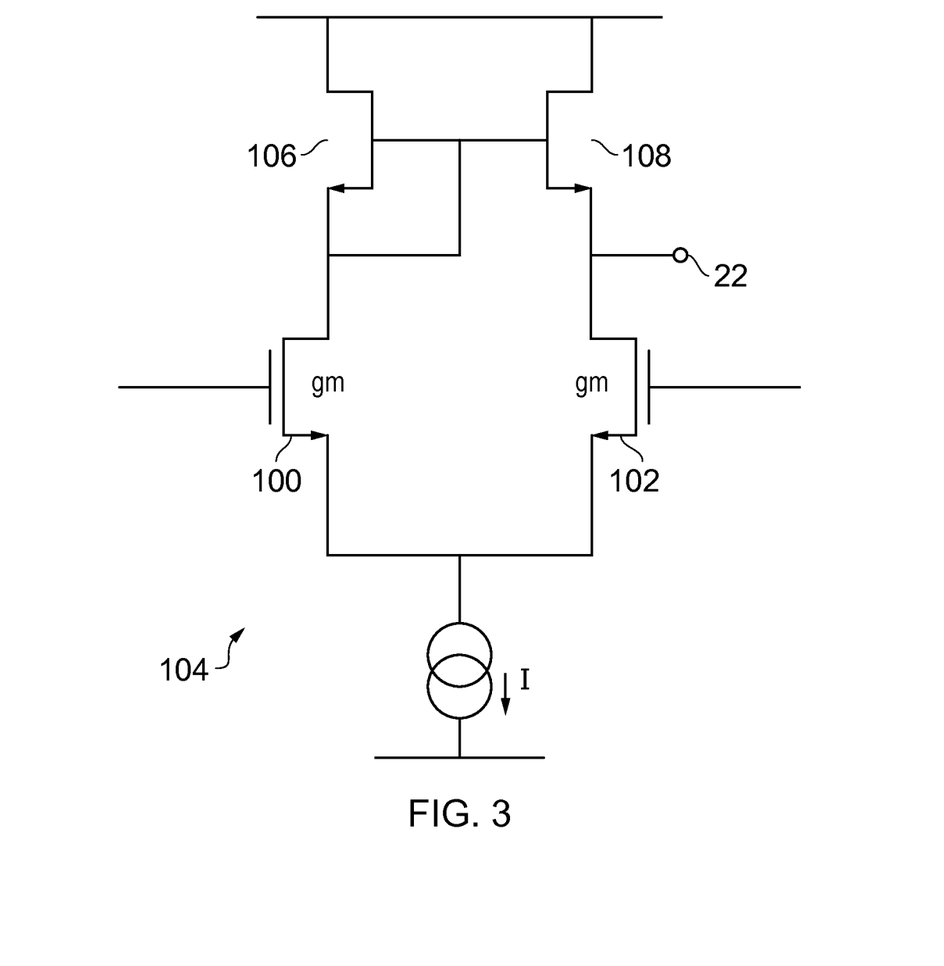
FIG. 3 is a schematic diagram of a single stage differential amplifier.

Suppose, for example, that the gain block is an operational amplifier as shown in FIG. 3. Here each FET 100 and 102 of the differential input stage 104 has a high impedance active load formed by transistors 106 and 108. As a result the output impedance of the amplifier is a function of the trans conductance, $g_m$, of the transistors as $$g_m = \frac{dI_d}{dV_g s} \qquad \text{equation 8}$$

Where $I_d$=drain current $V_g s$=gate-source voltage

And the effective output impedance is $$\frac{dV_g s}{dI_d} = \frac{1}{g_m} \qquad \text{equation 9}$$

The transconductance $g_m$ depends on the drain current. A typical value of $g_m$ may be around 330 or so.

This brings the noise bandwidth down to around $$\frac{1}{4 \times 3300 \times 10^{-12}} = 75 \text{ MHz} \qquad \text{equation 10}$$

Thus the prior art circuit has a large noise acceptance bandwidth. However, in the present invention, the bandwidth is primarily set by the bandwidth of the filter formed by the feedback capacitor 50 and the impedance of the resistor 62.

Ordinarily such a filter would have a bandwidth of $$\text{Filter bandwidth} = \frac{1}{2\pi} \cdot \frac{\pi}{2} \cdot \frac{1}{R_L \cdot C_{feedback}} \qquad \text{equation 11}$$

where $R_L$ is the resistance $R_f$ of the resistor 62 in series with the output resistance $R_{out}$ of the gain stage and $C_{feedback}$ is the capacitance of the capacitor 50.

However, the amplifier acts as an inverting amplifier, so for an amplifier having a gain of A, each $+\Delta V$ of the non-inverting input gives rise to a $-A \cdot \Delta V$ at the output, and hence the current flow through the feedback capacitor is equivalent to having a capacitor of size $A \cdot C_{feedback}$ (strictly $(A+1) \cdot C_{feedback}$) but these numbers converge to the similar, i.e. less than a few present difference for A>50, which is a very modest gain for such an amplifier.

Thus during phase φ1 when switches 32 and 64 are closed, the sampled noise becomes much reduced, and can be represented by $$\text{noise power} = 4k_b TR \cdot \frac{\pi}{2} \cdot \frac{1}{2\pi} \cdot \frac{1}{R \cdot C_{feedback}} \qquad \text{equation 12}$$

$$= \frac{k_B T}{A \cdot C_{feedback}}$$

One way to consider this is to regard the input signal as being acquired only to the extent that the corresponding charge is acquired (i.e. stored) on the combination of the sampling capacitor 30 and the feedback capacitor 50.

The noise is sampled on to the combination of the sampling capacitor 30 having a capacitance Cs and the feedback capacitor 50 having a value Cf, whose capacitance is further enhanced by the Miller effect. Furthermore from the point of view of noise occurring at the inverting input 18 of the gain block, these capacitors appear in parallel, so the effective capacitance Ce is $$Ce = Cs + ACf \qquad \text{equation 13}$$

where Cs is the capacitance of the sampling capacitor, Cf is the capacitance of the feedback capacitor and A is the gain of the gain block.

The resistance Re of the circuit is primarily that in the feedback loop, $$Re = Rf/A + R_{out} \qquad \text{equation 14}$$

So during the first state, when φ1 is asserted, the noise bandwidth is $$\text{noise bandwidth} = \frac{1}{2\pi} \cdot \frac{\pi}{2} \cdot \frac{1}{R_e \cdot C_e} \qquad \text{equation 15}$$

$$\text{noise bandwidth} = \frac{1}{2\pi} \cdot \frac{\pi}{2} \cdot \frac{1}{(R_f/A + R_{out})(C_s + AC_f)} \qquad \text{equation 16}$$

$$\text{noise bandwidth} = \qquad \text{equation 17}$$

$$\frac{1}{2\pi} \cdot \frac{\pi}{2} \cdot \frac{1}{(C_s R_f/A) + C_s R_{out} + R_f C_f + AC_f R_{out}}$$

We can relate A and $R_{out}$ to the transconductance $g_m$ of the gain stage in this example with an active load since $A=g_m$ and $$R_{out} = 1/g_m \qquad \text{equation 18}$$

noise bandwidth =

$$\frac{1}{2\pi} \cdot \frac{\pi}{2} \cdot \frac{1}{(C_s R_f/g_m) + C_s/g_m + R_f C_f + C_f}$$

Each term in the denominator is additive with the other terms, but it can be seen that the denominator can be controlled by making $C_f R_f$ the dominant term, i.e $$C_f R_f > Cs(1+R_f)/g_m \qquad \text{equation 19}$$

In the second phase, when φ1 is unasserted and φ2 is asserted charge is acquired onto the sampling and feedback capacitors. This acquired charge represents both the input signal and the noise from the various thermal noise sources (switches and gain stage). The charge acquired by the feedback capacitor 50 is dependent on the acceptance bandwidth, set by $C_f/g_m$. Whilst noise below the acceptance bandwidth is acquired by the circuit, charge acquired on the sampling capacitor above the acceptance bandwidth is also acquired onto the feedback capacitor with an approximately equal and opposite value. This has the effect of substantially cancelling the input referenced noise at frequencies above the acceptance bandwidth such that it effectively does not get sampled.

Figure 4:
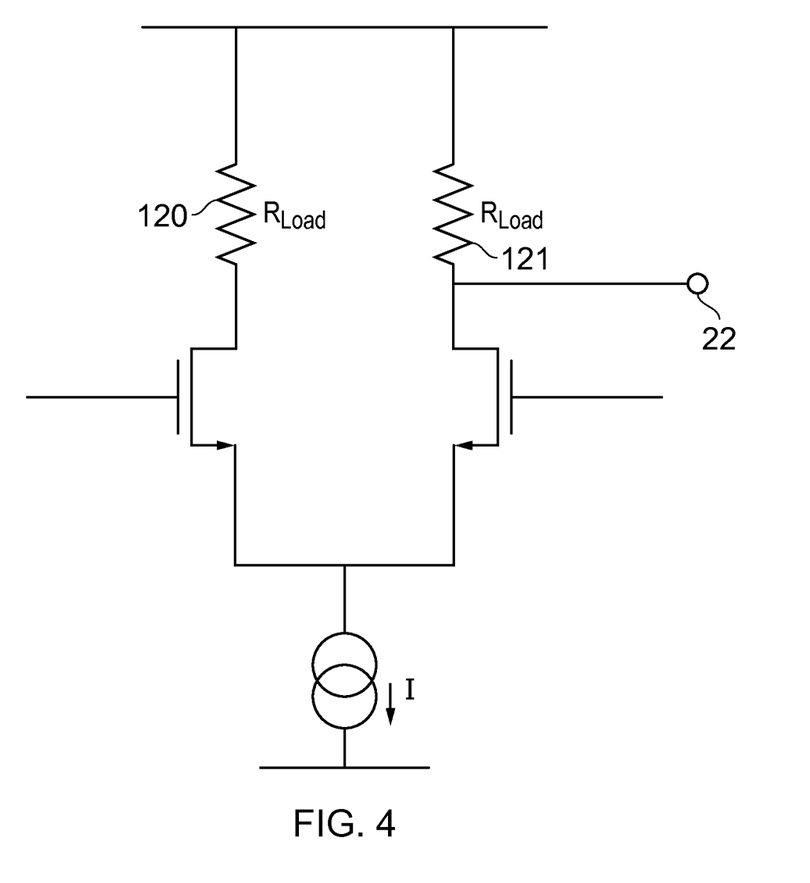
FIG. 4 is a schematic diagram of an alternative single stage differential amplifier.

The gain stage of FIG. 3 is not constrained to have active loads, and can be implemented with resistive loads indicated by resistors 120 and 121 having resistances $R_{load}$ as shown in FIG. 4. Here the gain G can be approximated as $$G = g_m R_{load} \qquad \text{equation 20}$$

Figure 5:
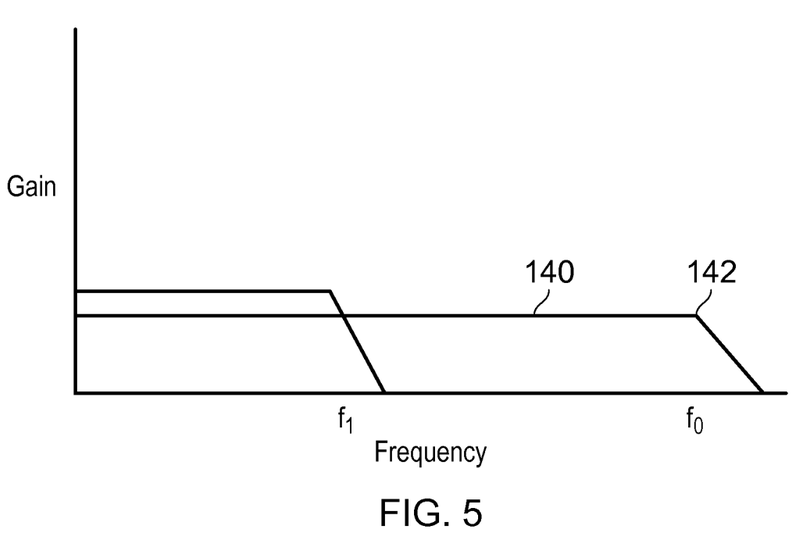
FIG. 5 is a diagram showing a the change to a gain block frequency response according to an embodiment of the invention.

Given that an amplifier was present in the prior art, and in the present invention, then embodiments of the present invention always give an improvement in noise provided Rf is large enough. Typically this is achieved by making the 3 dB point of the filter formed by the feedback capacitor 50 and the resistor 62 less than one half, and generally less than one third the frequency of the gain blocks 3 dB point as measured when the output 22 is connected to the inverting input 18. Such an arrangement is shown in FIG. 5 where gain versus frequency characteristic is schematically illustrated. The amplifier of the prior art, where the switch is used to connect the output node 22 to the inverting input 18 forms a substantially unity gain voltage follower as indicated by response 140, and having a breakpoint 142 occurring at frequency $f_0$. In embodiments of the present invention, the controllable impedance 60 co-operates with the feedback capacitor 50 to place a breakpoint in the response characteristic at a frequency $f_1$ which is significantly less than $f_0$. The resistance of the controllable impedance may cause the gain of the amplifier to exceed unity during this phase of operation.

It is also possible for the circuit to provide further improvements in noise power, to the extent that the it removes more noise power than the input stage of the amplifier introduces. Although the noise power of an amplifier is the accumulation of the noise introduced at each stage thereof, the majority of the noise can be regarded as being attributable to the input stage. Thus, multistage amplifiers have an improved gain over single stage amplifiers, but most of the noise is attributable to the input stage.

Literature indicated that the noise power spectral density of a single stage amplifier of the type shown in FIG. 3 can be approximated as $$\text{noise power} = \left(2 \cdot \frac{8 k_B T}{3 g_m}\right) \qquad \text{equation 21}$$

$$\text{and the noise bandwidth} = A/4 \cdot Z_f \cdot C_{sample} \qquad \text{equation 22}$$

Where Zf is the impedance of the feedback network. Thus provided $A/(Zf.g_m)$ is less than ¾ then the noise sampled into the system can be reduced below $k_B T/C_{sample}$.

The sampling capacitor, or indeed the feedback capacitor need not be fixed in size. Either of these capacitors may be a variable capacitor, for example a capacitive transducer. In such a circuit V1 and V2 are fixed reference voltages, and then the output of the amplifier 10 depends on the relative values of the sampling and feedback capacitors.

It follows that when moving from one cycle of operation to the next, the feedback capacitor has to have sufficient time to discharge from the voltage across it at the end of one sample to the voltage that should be across it to compensate for any amplifier offset, but otherwise substantially 0 Volts. This can be achieved by selecting the impedance of the controllable impedance to be sufficiently low to achieve this, or alternatively by providing a shorting switch which can be briefly operated to discharge the capacitor at the beginning of each operating cycle. The controllable impedance may be implemented as a thin FET so that the "on" channel resistance is comparatively large.

The claims presented here have been written in single dependency format for use at the Unites States Patent office. However it is to be assumed that each claim may depend on any preceding claim of the same type, except where that is clearly technically infeasible.

The invention claimed is:

1. An amplifier, comprising:
   an input node, the input node being connectable to a first signal input node and a second signal input node;
   a gain stage having a gain stage inverting input, a gain stage non-inverting input and a gain stage output;
   a feedback capacitor connected in a signal path between the gain stage output and the gain stage inverting input;
   a sampling capacitor connected between the input node and the gain stage inverting input; and
   a controllable resistive impedance in parallel with the feedback capacitor,
   wherein the controllable resistive impedance is operable to switch between a first impedance state in which the controllable resistive impedance does not affect current flow through the feedback capacitor, and a second impedance state in which the controllable resistive impedance cooperates with the feedback capacitor to form a bandwidth limiting circuit.

2. An amplifier, comprising:
   an input node;
   a gain stage having a gain stage inverting input, a gain stage non-inverting input and a gain stage output;
   a feedback capacitor connected in a signal path between the gain stage output and the gain stage inverting input;
   a sampling capacitor connected between the input node and the gain stage inverting input; and
   a controllable resistive impedance in parallel with the feedback capacitor,
   wherein the controllable resistive impedance is operable to switch between a first impedance state in which the controllable resistive impedance does not affect current flow through the feedback capacitor, and a second impedance state in which the controllable resistive impedance cooperates with the feedback capacitor to form a bandwidth limiting circuit, and
   wherein the gain stage acts as a voltage follower having a break point in its gain versus frequency characteristic at a frequency $f_0$, and in the second impedance state, the bandwidth limiting circuit forms a low pass filter having a break point as $f_1$, wherein $f_1$ is less than half of $f_0$.

3. An amplifier as claimed in claim 2, in which $f_1 < f_0/3$.

4. An amplifier as claimed in claim 1, in which the product of the capacitance Cf of the feedback capacitor and a resistance Rf of the controllable resistive impedance is greater than the capacitance Cs of the sampling capacitor divided by the gain of the gain stage.

5. An amplifier as claimed in claim 1, in which an input node is connectable via a first switch to the first signal input node, and the first switch and the controllable resistive impedance are in a low impedance state simultaneously.

6. An amplifier as claimed in claim 5, in which the input node is connectable via a second switch to the second input signal node, and the second switch is placed in a low impedance state when the first switch is in a high impedance state.

7. A residue amplifier comprising an amplifier as claimed in claim 1.

8. A residue amplifier comprising an amplifier as claimed in claim 5.

9. An analog to digital converter including a residue amplifier as claimed in claim 7.

10. An amplifier as claimed in claim 1, in which at least one of the sampling capacitor and the feedback capacitor are capacitive sensors.

11. A method of reducing noise sampled into a sampling circuit, the sampling circuit comprising a sampling capacitor in association with a first sampling switch and a second sampling switch, wherein an amplifier in association with a bandwidth limiting circuit is connected to a plate of the sampling capacitor, the method comprising:
   closing the first sampling switch and a switch coupled between an inverting input of the amplifier and an output of the amplifier during a first phase to limit the noise sampled into the sampling circuit; and
   closing the second sampling switch during a second phase such that the amplifier acts as a charge transfer amplifier.

12. A method as claimed in claim 11, in which the bandwidth limiting circuit includes a feedback capacitor connected between the output of the amplifier and the inverting input, and an input referred offset is stored on the feedback capacitor during the first phase so as to reduce offset errors in the amplifier.

13. An amplifier, comprising:
   an input node;
   a gain stage having a gain stage inverting input, a gain stage non-inverting input and a gain stage output;
   a feedback capacitor connected in a signal path between the gain stage output and the gain stage inverting input;
   a sampling capacitor connected between the input node and the gain stage inverting input; and
   a controllable resistance in parallel with the feedback capacitor,
   wherein:
      the controllable resistance is operable to switch between a first impedance state in which the controllable resistance does not affect current flow through the feedback capacitor, and a second impedance state in which the controllable resistance cooperates with the feedback capacitor to form a bandwidth limiting circuit; and
      the input node is connectable via a first switch to a first signal input node, and the first switch and the controllable resistance are in a low impedance state simultaneously, and the input node is connectable via a second switch to a second input signal node, and the second switch is placed in a low impedance state when the first switch is in a high impedance state.

14. An amplifier as claimed in claim 13, wherein the gain stage has a break point in its gain versus frequency characteristic at a frequency $f_0$, and in the second impedance state, the bandwidth limiting circuit forms a low pass filter having a break point as $f_1$, where $f_1$ is less than half of $f_0$.

15. An amplifier as claimed in claim 14, in which $f_1 < f_0/3$.

16. An amplifier as claimed in claim 13, in which the product of a capacitance of the feedback capacitor and a resistance of the controllable resistance is greater than a capacitance of the sampling capacitor divided by a gain of the gain stage.

17. A residue amplifier comprising the amplifier as claimed in claim 13.

18. An analog to digital converter comprising the amplifier as claimed in claim 1, the amplifier amplifying a residue between a signal received at the first signal input node and a signal received at the second signal input node.

19. The method as claimed in claim 12, further comprising operating a resistive impedance in parallel with the feedback capacitor to switch between a first impedance state in which the resistive impedance does not affect current flow through the feedback capacitor, and a second impedance state in which the resistive impedance cooperates with the feedback capacitor to form the bandwidth limiting circuit.

20. An amplifier as claimed in claim 13, further comprising a third switch coupled between the input node of the amplifier and an output node of the amplifier, wherein the first switch and the third switch are closed during a first phase to limit a sampled noise, and wherein the second switch is operated during a second phase such that the amplifier acts as a charge transfer amplifier.

* * * * *